(12) United States Patent
Taniguchi et al.

(10) Patent No.: US 8,865,835 B2
(45) Date of Patent: Oct. 21, 2014

(54) SOLAR CELL SEALING MATERIAL AND SOLAR CELL MODULE PRODUCED USING THE SAME

(75) Inventors: Kouichirou Taniguchi, Nagahama (JP); Jun Nishioka, Nagahama (JP); Ryota Yamamoto, Nagahama (JP); Yo Miyashita, Nagahama (JP)

(73) Assignee: Mitsubishi Plastics, Inc., Tokyo (JP)

( * ) Notice: Subject to any disclaimer, the term of this patent is extended or adjusted under 35 U.S.C. 154(b) by 0 days.

(21) Appl. No.: 13/143,803

(22) PCT Filed: Jul. 16, 2010

(86) PCT No.: PCT/JP2010/062074
§ 371 (c)(1),
(2), (4) Date: Jul. 8, 2011

(87) PCT Pub. No.: WO2011/007871
PCT Pub. Date: Jan. 20, 2011

(65) Prior Publication Data
US 2011/0303264 A1 Dec. 15, 2011

(30) Foreign Application Priority Data
Jul. 17, 2009 (JP) .................................. 2009-168417

(51) Int. Cl.
| | | |
|---|---|---|
| *H01L 31/0203* | (2014.01) | |
| *C09D 153/00* | (2006.01) | |
| *C08L 53/00* | (2006.01) | |
| *C08L 23/04* | (2006.01) | |
| *H01L 31/048* | (2014.01) | |
| *C08L 23/08* | (2006.01) | |

(52) U.S. Cl.
CPC ......... *H01L 31/048* (2013.01); *C08L 2203/204* (2013.01); *Y02E 10/50* (2013.01); *H01L 31/0481* (2013.01); *C08L 53/00* (2013.01); *C08L 23/0815* (2013.01)
USPC ............................................. 525/88; 525/95

(58) Field of Classification Search
USPC ..................................................... 525/88, 95
See application file for complete search history.

(56) References Cited

U.S. PATENT DOCUMENTS

| | | | |
|---|---|---|---|
| 6,693,237 B2 | 2/2004 | Yamada et al. | |
| 2004/0086677 A1* | 5/2004 | Bowen et al. | ................ 428/41.8 |
| 2007/0267059 A1 | 11/2007 | Nishijima et al. | |
| 2008/0108757 A1 | 5/2008 | Hoya et al. | |
| 2010/0084158 A1* | 4/2010 | Gau et al. | ................ 174/110 SR |
| 2010/0113698 A1* | 5/2010 | Walton et al. | ................... 525/88 |

FOREIGN PATENT DOCUMENTS

| | | |
|---|---|---|
| EP | 2 048 194 | 4/2009 |
| JP | 58-060579 | 4/1983 |
| JP | 2001-332750 | 11/2001 |
| JP | 2002-235048 | 8/2002 |
| JP | 2006-210905 | 8/2006 |
| JP | 2006-210906 | 8/2006 |
| WO | WO 2005/090425 | 9/2005 |
| WO | WO 2006/102150 | 9/2006 |
| WO | WO 2007/119767 | 10/2007 |
| WO | WO 2008/036707 | 3/2008 |
| WO | WO 2008/054637 | * 5/2008 |

OTHER PUBLICATIONS

International Search Report issued Oct. 26, 2010, in PCT/JP2010/062074.
U.S. Appl. No. 13/812,378, filed Jan. 25, 2013, Taniguchi, et al.
Office Action issued Apr. 28, 2011 in Taiwanese Patent Application No. 099123436 with English language translation.
Office Action issued Mar. 12, 2012 in Chinese Patent Application No. 201080003236.0 with English language translation.
European Search Report dated Nov. 21, 2013 in EP 10 79 9929; 6 pp.

* cited by examiner

*Primary Examiner* — Jeffrey Mullis
(74) *Attorney, Agent, or Firm* — Oblon, Spivak, McClelland, Maier & Neustadt, L.L.P.

(57) ABSTRACT

There is provided an encapsulant material for solar cells which facilitates production of a solar cell module and is excellent in flexibility, heat resistance, transparency, etc., and a solar cell module produced using the encapsulant material. The present invention relates to an encapsulant material for solar cells which includes a resin composition (C) containing an ethylene-α-olefin random copolymer (A) capable of satisfying the following condition (a) and an ethylene-α-olefin block copolymer (B) capable of satisfying the following condition (b): (a) a heat of crystal fusion is from 0 to 70 J/g as measured in differential scanning calorimetry at a heating rate of 10° C./min; and (b) a crystal fusion peak temperature is 100° C. or higher and a heat of crystal fusion is from 5 to 70 J/g as measured in differential scanning calorimetry at a heating rate of 10° C./min.

19 Claims, 1 Drawing Sheet

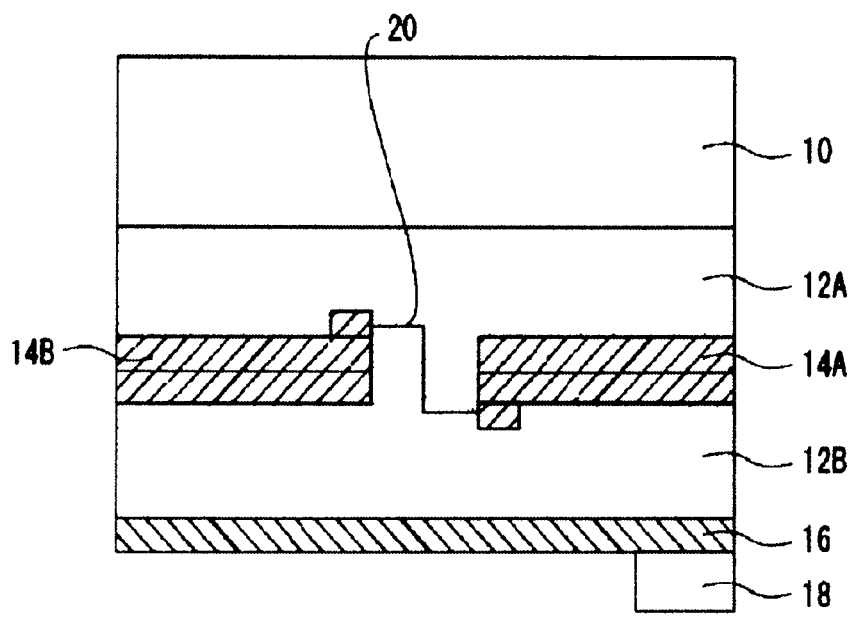

SOLAR CELL SEALING MATERIAL AND SOLAR CELL MODULE PRODUCED USING THE SAME

TECHNICAL FIELD

The present invention relates to encapsulant materials for solar cell elements for use in solar cell modules, and solar cell modules produced using the encapsulant materials. More particularly, the present invention relates to encapsulant materials for solar cells which facilitate production of solar cell modules and are excellent in flexibility, heat resistance, transparency and the like, and solar cell modules producing using the encapsulant materials.

BACKGROUND ART

With the recent high consciousness of environmental problems such as global warming, there is an increasing demand, in particular, for solar power generation systems in view of cleanness and pollution-free nature thereof. The solar cells serve as a central constituent part of the solar power generation systems capable of directly converting a solar energy into electricity. In general, the solar cells have a structure in which a plurality of solar cell elements (photovoltaic cells) are arranged in series or in parallel with each other by wiring, and these cells are protected by various packaging methods to provide a unit thereof. The unit incorporated in the package is called a "solar cell module". The solar cell module is generally constructed from a transparent substrate (glass/transparent solar cell sheet; front sheet) as an upper protective material covering a surface of the cells which is irradiated with sunlight, an encapsulant material (encapsulant resin layer) made of a thermoplastic resin (such as, e.g., ethylene-vinyl acetate copolymers) which is filled in a clearance between the cells, and a back surface sealing sheet (back sheet) as a lower protective material for protecting a back surface of the cells.

Since the solar cell module is mainly used outdoor, materials and structures used therein are required to exhibit various excellent properties. The properties mainly required for the encapsulant material include a flexibility or an impact resistance for protecting the solar cell elements, a heat resistance capable of withstanding heat generated from the solar cell module, and a transparency (such as total light transmission) for efficiently transmitting sunlight to the solar cell elements as well as a durability, a dimensional stability, a flame retardancy, a water vapor-barrier property, etc.

At present, as the encapsulant material for the solar cell elements in the solar cell module, ethylene-vinyl acetate copolymers (hereinafter occasionally referred to merely as "EVA") have been extensively used as a raw material thereof from the viewpoints of a good flexibility, a high transparency or the like (for example, refer to Patent Document 1). In addition, the EVA is crosslinked using a crosslinking agent such as an organic peroxide mainly for the purpose of imparting a heat resistance to EVA. Therefore, there is usually employed such a step of encapsulating the solar cell elements using an EVA sheet previously prepared by mixing the EVA with the crosslinking agent (organic peroxide) or a crosslinking assistant. Upon production of the EVA sheet, it is required that the sheet forming is carried out at a low temperature (usually in the range of from about 80 to about 100° C.) so as not to decompose the organic peroxide, which therefore makes it difficult to increase an extrusion molding rate used upon forming the sheet. Also, the encapsulating of the solar cell elements must be performed through two-stage steps including a step in which air relief or pre-bonding is carried out over a period of from several minutes to ten and several minutes in a laminator, and a step in which substantial bonding (crosslinking) is carried out over a period of from about ten and several minutes to about 60 minutes at an elevated temperature capable of decomposing the organic peroxide (usually in the range of from about 130 to about 150° C.) in an oven. For this reason, the production process of the solar cell module requires larger man-hour and prolonged time, thereby causing problems such as increase in production costs.

In addition, the encapsulant material for the solar cell elements which is obtained by using the EVA sheet has such a problem that a solar cell circuit is corroded or tends to be corroded with acetic acid generated due to hydrolysis of EVA, etc., when used for a long period of time. Further, there also tends to occur such a problem that peeling of the respective materials is caused owing to the crosslinking agent, the crosslinking assistant or acetic acid generated therefrom at an interface between the EVA sheet and the solar cell elements, an interface between the EVA sheet and the front sheet or an interface between the EVA sheet and the back sheet.

To solve these conventional problems, for example, Patent Document 2 discloses an encapsulant material for solar cells which is composed of a resin composition containing a non-crystalline α-olefin polymer and a crystalline α-olefin polymer, in which the solar cells are encapsulated without using the EVA sheet, and therefore encapsulating procedure is simplified by omitting a crosslinking step. More specifically, as the encapsulant material of Patent Document 2, the resin composition composed of a polymer containing propylene as a main component is used.

Also, Patent Document 3 discloses an encapsulant material for solar cells which is in the form of a polymer blend or a polymer alloy composed of at least one polyolefin-based copolymer and at least one crystalline polyolefin. More specifically, as the encapsulant material, there are described a polymer blend of a lower-melting point EVA and a higher-melting point EVA (refer to Example 1 of Patent Document 3), a polymer blend of an ethylene-methacrylic acid copolymer and an ordinary crystalline polyethylene (refer to Example 2 of Patent Document 3), and a polymer blend of an ethylene-methyl acrylate copolymer and an ordinary crystalline polypropylene (refer to Example 3 of Patent Document 3).

Patent Document 1: JP-A 58-60579
Patent Document 2: JP-A 2006-210905
Patent Document 3: JP-A 2001-332750

DISCLOSURE OF THE INVENTION

Problem to be Solved by the Invention

However, the resin composition composed of the polymer containing propylene as a main component as used in Patent Document 2 tends to be still insufficient in transparency (total light transmission: 83.2%; see Examples of Patent Document 2). In addition, the polymer containing propylene as a main component tends to have problems such as a high brittle temperature and insufficient low-temperature properties. Also, all of the polymer blends used in Patent Document 3 do not necessarily have a good transparency depending upon combination of the polymers blended therein, in particular, there tends to still occur such a problem that the polymer blends are unsatisfactory in balance between flexibility, heat resistance and transparency. That is, these Patent Documents 2 and 3 still fail to provide an encapsulant material capable of satisfying all properties as required such as flexibility, heat resistance and transparency.

In consequence, an object of the present invention is to provide an encapsulant material for solar cells which facilitates production of a solar cell module and is excellent in flexibility, heat resistance, transparency, etc., and a solar cell module produced by using the encapsulant material Means for Solving the Problem As a result of extensive and intensive researches, the present inventors have found that an encapsulant material using a resin composition containing an ethylene-α-olefin random copolymer having specific thermal properties and an ethylene-α-olefin block copolymer having specific thermal properties is capable of satisfying excellent flexibility, heat resistance and transparency at the same time. The present invention has been accomplished based on the finding.

Thus, the present invention relates to an encapsulant material for solar cells, including a resin composition (C) containing an ethylene-α-olefin random copolymer (A) capable of satisfying the following condition (a) and an ethylene-α-olefin block copolymer (B) capable of satisfying the following condition (b):

(a) a heat of crystal fusion is from 0 to 70 J/g as measured in differential scanning calorimetry at a heating rate of 10° C./min; and (b) a crystal fusion peak temperature is 100° C. or higher and a heat of crystal fusion is from 5 to 70 J/g as measured in differential scanning calorimetry at a heating rate of 10° C./min.

The present invention also relates to a solar cell module produced by using the above encapsulant material for solar cells according to the present invention.

Effect of the Invention

In accordance with the present invention, there are provided an encapsulant material for solar cells which facilitates production of a solar cell module and is excellent in flexibility, heat resistance, transparency, etc., and a solar cell module produced by using the encapsulant material.

Also, the encapsulant material is free from occurrence of corrosion of a solar cell circuit owing to generation of acetic acid and need not be subjected to a crosslinking step, which results in improved productivity upon production of a solar cell module. In addition, the present invention is applicable to not only a batch type production facility but also a roll-to-roll type production facility. As a result, it is expected that the solar cell module can be produced at considerably low costs.

BRIEF DESCRIPTION OF THE DRAWING

FIG. 1 is a schematic sectional view of an example of a solar cell module according to the present invention.

EMBODIMENTS FOR CARRYING OUT THE INVENTION

The present invention is described in detail below.

It is important that the encapsulant material for solar cells according to the present invention includes a resin composition (C) containing an ethylene-α-olefin random copolymer (A) capable of satisfying the following condition (a) and an ethylene-α-olefin block copolymer (B) capable of satisfying the following condition (b):

(a) a heat of crystal fusion is from 0 to 70 J/g as measured in differential scanning calorimetry at a heating rate of 10° C./min; and (b) a crystal fusion peak temperature is 100° C. or higher and a heat of crystal fusion is from 5 to 70 J/g as measured in differential scanning calorimetry at a heating rate of 10° C./min.

[Ethylene-α-Olefin Random Copolymer (A)]

The ethylene-α-olefin random copolymer (A) used in the present invention is not particularly limited as long as it satisfies the above condition (a), and usually suitably used in the form of a random copolymer of ethylene with an α-olefin having 3 to 20 carbon atoms. Examples of the α-olefin to be copolymerized with ethylene include propylene, 1-butene, 1-pentene, 1-hexene, 1-heptene, 1-octene, 1-nonene, 1-decene, 3-methyl-butene-1 and 4-methyl-pentene-1. Among these α-olefins copolymerized with ethylene, from the viewpoints of industrial availability, various properties and economy, propylene, 1-butene, 1-hexene and 1-octene are preferably used in the present invention. The α-olefins copolymerized with ethylene may be used alone or in combination of any two or more thereof.

The content of the α-olefin copolymerized with ethylene in the ethylene-α-olefin random copolymer (A) is not particularly limited as long as it satisfies the above condition (a), and is usually 2 mol % or more, preferably 40 mol % or less, more preferably from 3 to 30 mol % and still more preferably from 5 to 25 mol % on the basis of 100 mol % of whole monomer units contained in the ethylene-α-olefin random copolymer (A). When the content of the α-olefin lies within the above-specified range, the resulting copolymer exhibits a reduced crystallinity owing to the copolymerized component, and is therefore improved in transparency. Also, raw material pellets can be suitably prevented from defects such as blocking. Meanwhile, the type and content of the α-olefin copolymerized with ethylene may be determined by a conventionally known qualitative/quantitative analysis, for example, using a nuclear magnetic resonance (NMR) analyzer or other equipments or analyzers.

The ethylene-α-olefin random copolymer (A) may also contain monomer units derived from monomers other than the α-olefin as long as the above condition (a) is satisfied. Examples of the other monomers include cyclic olefins, vinyl aromatic compounds (such as styrene) and polyene compounds. The content of the monomer units derived from the other monomers in the ethylene-α-olefin random copolymer (A) is 20 mol % or less and preferably 15 mol % or less on the basis of 100 mol % of whole monomer units contained in the ethylene-α-olefin random copolymer (A). The configuration, branched structure, branching degree distribution and molecular weight distribution of the ethylene-α-olefin random copolymer (A) are also not particularly limited as long as the above condition (a) is satisfied. However, for example, such a copolymer having a long chain branched structure is preferably used because the copolymer generally exhibits good mechanical properties and also has advantages such as a high melt tension upon forming the copolymer into a sheet and therefore a good calendering property. In addition, a copolymer having a narrow molecular weight distribution which is obtained by polymerization using a single site catalyst has such an advantage that raw material pellets produced therefrom are relatively free from blocking owing to a small content of low-molecular weight components therein.

The melt flow rate (MFR) of the ethylene-α-olefin random copolymer (A) used in the present invention is not particularly limited, and is usually from about 0.5 to about 100 g/10 min, preferably from 2 to 50 g/10 min and more preferably from 3 to 30 g/10 min (as measured according to JIS K 7210 at a temperature of 190° C. under an applied load of 21.18 N). In the present invention, the MFR of the ethylene-α-olefin random copolymer (A) may be selectively adjusted in view of processability upon sheet forming, adhesion upon encapsulating solar cell elements (photovoltaic cells) and extent of wrapping around. For example, when forming the sheet by calendering, the MFR of the ethylene-α-olefin random copolymer (A) is preferably relatively low, specifically, from about 0.5 to about 5 g/10 min from the viewpoint of a good handling property upon releasing the sheet from a calender roll. When forming the sheet by extrusion molding using a T-die, the MFR of the ethylene-α-olefin random copolymer (A) is preferably from 2 to 50 g/10 min and more preferably from 3 to 30 g/10 min from the viewpoints of a reduced extrusion load and an increased extrusion output. Further, the MFR of the ethylene-α-olefin random copolymer (A) is preferably from 2 to 50 g/10 min and more preferably from 3 to 30 g/10 min from the viewpoints of adhesion upon encapsulating the solar cell elements (photovoltaic cells) and easiness of wrapping around.

The method for producing the ethylene-α-olefin random copolymer (A) used in the present invention is not particularly limited, and the ethylene-α-olefin random copolymer (A) may be produced by any conventionally known polymerization methods using any conventionally known polymerization catalysts for olefins. Example of the polymerization methods include a slurry polymerization method, a solution polymerization method, a bulk polymerization method and a vapor phase polymerization method using a multi-site catalyst such as typically Ziegler-Natta catalysts or a single site catalyst such as typically metallocene-based catalysts and post-metallocene-based catalysts, as well as a bulk polymerization method using a radical polymerization initiator, etc. Among these polymerization methods, since the ethylene-α-olefin random copolymer (A) is a relatively soft resin, the polymerization methods using a single site catalyst which are capable of polymerizing raw materials containing a less amount of low-molecular weight components and therefore having a narrow molecular weight distribution are preferably used in the present invention from the viewpoints of facilitated granulation (pelletization) thereof after the polymerization and prevention of blocking of the raw material pellets.

The ethylene-α-olefin random copolymer (A) used in the present invention is required to satisfy the condition (a) that a heat of crystal fusion thereof is from 0 to 70 J/g as measured in differential scanning calorimetry at a heating rate of 10° C./min. The heat of crystal fusion of the ethylene-α-olefin random copolymer (A) is preferably from 5 to 70 J/g and more preferably from 10 to 65 J/g. When the heat of crystal fusion of the copolymer (A) lies within the above-specified range, the resulting encapsulant material for solar cells according to the present invention ensures a good flexibility and a high transparency (total light transmission). When the heat of crystal fusion of the ethylene-α-olefin random copolymer (A) is 5 J/g or more, the raw material pellets can be suitably prevented from defects such as blocking. The reference values of the heat of crystal fusion of various compounds are from about 170 to about 220 J/g for ordinary high-density polyethylenes (HDPE), and from about 100 to about 160 J/g for low-density polyethylenes (LDPE) or linear low-density polyethylenes (LLDPE).

The heat of crystal fusion of the ethylene-α-olefin random copolymer (A) may be measured using a differential scanning calorimeter at a heating rate of 10° C./min according to JIS K 7122.

The crystal fusion peak temperature of the ethylene-α-olefin random copolymer (A) used in the present invention is also not particularly limited, and is usually lower than 100° C., and may be frequently in the range of from 30 to 90° C. The reference values of the crystal fusion peak temperature of various compounds are from about 130 to about 145° C. for ordinary high-density polyethylenes (HDPE), and from about 100 to about 120° C. for low-density polyethylenes (LDPE) or linear low-density polyethylenes (LLDPE). Thus, when using the ethylene-α-olefin random copolymer (A) solely, it is difficult to achieve a crystal fusion peak temperature of 100° C. or higher and a heat of crystal fusion of from 5 to 70 J/g as measured in differential scanning calorimetry at a heating rate of 10° C./min.

The crystal fusion peak temperature of the ethylene-α-olefin random copolymer (A) may be measured using a differential scanning calorimeter at a heating rate of 10° C./min according to JIS K 7121.

Specific examples of the ethylene-α-olefin random copolymer (A) used in the present invention include "Engage" and "Affinity" (tradenames) both available from Dow Chemical Co., "TAFMER A" and "TAFMER P" (tradenames) both available from Mitsui Chemicals, Inc., and "Karnel" (tradename) available from Japan Polyethylene Corp.

[Ethylene-α-Olefin Block Copolymer (B)]

The ethylene-α-olefin block copolymer (B) used in the present invention is not particularly limited as long as it satisfies the above condition (b), and suitably used in the form of a block copolymer of ethylene with an α-olefin having 3 to 20 carbon atoms. Examples of the α-olefin to be copolymerized with ethylene include propylene, 1-butene, 1-pentene, 1-hexene, 1-heptene, 1-octene, 1-nonene, 1-decene, 3-methyl-butene-1 and 4-methyl-pentene-1. Among these α-olefins to be copolymerized with ethylene, from the viewpoints of industrial availability, various properties and economy, propylene, 1-butene, 1-hexene and 1-octene are preferably used in the present invention. The α-olefins to be copolymerized with ethylene may be used alone or in combination of any two or more thereof.

The ethylene-α-olefin block copolymer (B) may also contain monomer units derived from monomers other than the α-olefin as long as the above condition (b) is satisfied. Examples of the other monomers include cyclic olefins, vinyl aromatic compounds (such as styrene) and polyene compounds. The content of the monomer units derived from the other monomers in the ethylene-α-olefin block copolymer (B) is 20 mol % or less and preferably 15 mol % or less on the basis of 100 mol % of whole monomer units contained in the ethylene-α-olefin block copolymer (B).

The block structure of the ethylene-α-olefin block copolymer (B) is also not particularly limited as long as the above condition (b) is satisfied. However, from a good balance of a flexibility, a heat resistance, a transparency, etc., the ethylene-α-olefin block copolymer (B) preferably has a multi-block structure containing two or more, preferably three or more segments or blocks which are different in comonomer contents, crystallinity, density, crystal fusion peak temperature (melting point Tm) or glass transition temperature (Tg) from each other. Specific examples of the multi-block structure include a completely symmetric block structure, an asymmetric block structure and a tapered block structure (such a block structure in which proportions of respective blocks are gradually increased in a main chain thereof). The copolymers having the above multi-block structure and a process for production thereof which may be adopted in the present invention are described in detail, for example, in PCT Pamphlet WO 2005/090425, PCT Pamphlet WO 2005/090426, PCT Pamphlet WO 2005/090427, etc.

The ethylene-α-olefin block copolymer having the above multi-block structure which may be used in the present invention is described in detail below.

In the present invention, the ethylene-α-olefin block copolymer having the multi-block structure can be suitably used. Among these copolymers, preferred are ethylene-octene multi-block copolymers which are obtained by using 1-octene as the α-olefin as a comonomer component thereof. The above ethylene-octene multi-block copolymers are preferably in the form of a multi-block copolymer including two or more substantially non-crystalline soft segments containing a large amount (from about 15 to about 20 mol %) of an octene component copolymerized with ethylene, and two or more high-crystalline hard segments having a crystal fusion peak temperature of from 110 to 145° C. which contain a less amount (less than about 2 mol %) of the octene component copolymerized with ethylene. By well controlling chain lengths and proportions of the soft segment and the hard segment, it is possible to enhance both a flexibility and a heat resistance of the copolymers.

Specific examples of the copolymers having the multi-block structure include "Infuse" (tradename) available from Dow Chemical Co.

The melt flow rate (MFR) of the ethylene-α-olefin block copolymer (B) used in the present invention is not particularly limited, and is usually from about 0.5 to about 100 g/10 min, preferably from 1 to 50 g/10 min, more preferably from 1 to 30 g/10 min and especially preferably from 1 to 10 g/10 min (as measured according to JIS K 7210 at a temperature of 190° C. under an applied load of 21.18 N).

In the present invention, the MFR of the ethylene-α-olefin block copolymer (B) may be selectively adjusted in view of processability upon sheet forming, adhesion upon encapsulating solar cell elements (photovoltaic cells) and extent of wrapping around. More concretely, when forming the sheet by calendaring method, the MFR of the ethylene-α-olefin block copolymer (B) is preferably relatively low, specifically, from about 0.5 to about 5 g/10 min from the viewpoint of a good handling property upon releasing the sheet from a calender roll. When forming the sheet by extrusion molding using a T-die, the MFR of the ethylene-α-olefin block copolymer (B) is preferably from 1 to 30 g/10 min from the viewpoints of a reduced extrusion load and an increased extrusion output. Further, the MFR of the ethylene-α-olefin block copolymer (B) is preferably from 3 to 50 g/10 min from the viewpoints of adhesion upon encapsulating the solar cell elements (photovoltaic cells) and easiness of wrapping around.

The ethylene-α-olefin block copolymer (B) used in the present invention is required to satisfy the condition (b) that a crystal fusion peak temperature thereof is 100° C. or higher and a heat of crystal fusion thereof is from 5 to 70 J/g as measured in differential scanning calorimetry at a heating rate of 10° C./min. The crystal fusion peak temperature of the ethylene-α-olefin block copolymer (B) is preferably 105° C. or higher and more preferably 110° C. or higher, and the upper limit of the crystal fusion peak temperature is usually 145° C. The heat of crystal fusion of the ethylene-α-olefin block copolymer (B) is preferably from 10 to 60 J/g and more preferably from 15 to 55 J/g. The crystal fusion peak temperature and the heat of crystal fusion of the ethylene-α-olefin block copolymer (B) may be measured by the same methods as described above.

In general, the solar cell module is heated to a temperature of from about 85 to about 90° C. owing to heat generated upon power generation and radiation heating by sunlight. When the copolymer has a crystal fusion peak temperature of 100° C. or higher, the encapsulant material for solar cells according to the present invention can ensure a sufficient heat resistance. On the other hand, when the upper limit of the crystal fusion peak temperature of the copolymer is 145° C., the sealing step for the solar cell elements can be suitably performed without using an excessively high temperature. In addition, when the heat of crystal fusion of the copolymer lies within the above-specified range, the encapsulant material for solar cells according to the present invention can ensure a good flexibility, a high transparency (total light transmission) and the like, and the raw material pellets can be effectively prevented from defects such as blocking.

[Resin Composition (C)]

The encapsulant material for solar cells according to the present invention includes a resin composition (C) containing the ethylene-α-olefin random copolymer (A) and the ethylene-α-olefin block copolymer (B) as described above. The α-olefins respectively used in the ethylene-α-olefin random copolymer (A) and the ethylene-α-olefin block copolymer (B) may be either the same or different from each other. In the present invention, when the α-olefins respectively used in the ethylene-α-olefin random copolymer (A) and the ethylene-α-olefin block copolymer (B) are identical to each other, the compatibility between the copolymers upon mixing and the transparency of the encapsulant material for solar cells can be more improved, namely, the resulting solar cell can be suitably enhanced in photovoltaic energy conversion efficiency.

The contents of the ethylene-α-olefin random copolymer (A) and the ethylene-α-olefin block copolymer (B) in the resin composition (C) are preferably from 50 to 99% by mass and from 1 to 50% by mass, respectively, more preferably from 60 to 98% by mass and from 2 to 40% by mass, respectively, still more preferably from 70 to 97% by mass and from 3 to 30% by mass, respectively, from the viewpoint of an excellent balance of a flexibility, a heat resistance, a transparency, etc. The mixing mass ratio (content ratio by mass) of the ethylene-α-olefin random copolymer (A) to the ethylene-α-olefin block copolymer (B) [(A)/(B)] is not particularly limited, and is preferably 99 to 50/1 to 50, more preferably 98 to 60/2 to 40, still more preferably 97 to 70/3 to 30, further still more preferably 97 to 80/3 to 20 and especially preferably 97 to 90/3 to 10 with the proviso that the total amount of the copolymers (A) and (B) is 100 parts by mass. The mixing mass ratio (content ratio by mass) (A)/(B) lies within the above-specified range, the resulting encapsulant material for solar cells can exhibit an excellent balance of a flexibility, a heat resistance, a transparency, etc.

The resin composition (C) constituting the encapsulant material for solar cells according to the present invention may also contain resins other than the ethylene-α-olefin random copolymer (A) and the ethylene-α-olefin block copolymer (B) unless departing from the subject matter of the present invention for the purpose of further improving various properties (such as a flexibility, a heat resistance, a transparency, an adhesion property, etc.) as well as a processability and economy. Examples of the resins other than the copolymers (A) and (B) include other polyolefin-based resins, various elastomers (such as olefin-based elastomers and styrene-based elastomers), resins modified with a polar group such as a carboxyl group, an amino group, an imide group, a hydroxyl group, an epoxy group, an oxazoline group, a thiol group and a silanol group, and tackifying resins.

Examples of the tackifying resins include petroleum resins, terpene resins, coumarone-indene resins, rosin-based resins and hydrogenated derivatives of these resins. Specific examples of the petroleum resins include alicyclic petroleum resins obtained from cyclopentadiene or a dimer thereof, and aromatic petroleum resins obtained from $C_9$ components. Specific examples of the terpene resins include terpene resins and terpene-phenol resins obtained from β-pinene. Specific examples of the rosin-based resins include rosin resins such as gum rosins and wood rosins, and esterified rosin resins modified with glycerol, pentaerythritol, etc. The tackifying resins may have various softening temperatures mainly depending upon a molecular weight thereof. As the tackifying resins, hydrogenated derivatives of alicyclic petroleum resins having a softening temperature of from 100 to 150° C. and preferably from 120 to 140° C. are especially preferred from the viewpoints of a good compatibility of the copolymers (A) and (B) when mixed with each other, a bleeding property with time in the encapsulant material, a color tone, a thermal stability, etc. The resins other than the copolymers (A) and (B) may be usually compounded in the resin composition (C) in an amount of preferably 20% by mass or less and more preferably 10% by mass or less on the basis of 100% by mass of the resin composition (C).

The resin composition (C) constituting the encapsulant material for solar cells according to the present invention may also contain various additives, if required. Examples of the additives include a silane coupling agent, an antioxidant, an ultraviolet absorber, a weathering stabilizer, a light diffusing agent, a nucleating agent, a pigment (e.g., white pigment), a flame retarder and an anti-fading agent. In the present invention, for the reasons as described below, the resin composition preferably contains at least one additive selected from the group consisting of a silane coupling agent, an antioxidant, an ultraviolet absorber and a weathering stabilizer. In addition, in the present invention, it is not particularly required to add a crosslinking agent or a crosslinking assistant to the resin composition (C). However, a crosslinking agent or a crosslinking assistant may be added to the resin composition (C). For example, the crosslinking agent and/or crosslinking assistant may be added in the case where the resin composition (C) is required to have a high heat resistance.

The silane coupling agent is effective to enhance adhesion of the encapsulant material to a protective material (such as glass, a resin front sheet and a back sheet) or to the solar cell elements. Examples of the silane coupling agent include compounds containing an unsaturated group such as a vinyl group, an acryloxy group and a methacryloxy group, an amino group, an epoxy group, as well as a hydrolysable group such as an alkoxy group. Specific examples of the silane coupling agent include N-β-aminoethyl)-γ-aminopropyl trimethoxysilane, N-(β-aminoethyl)-γ-aminopropylmethyl dimethoxysilane, γ-aminopropyl triethoxysilane, γ-glycidoxypropyl trimethoxysilane and γ-methacryloxypropyl trimethoxysilane. In the present invention, among these silane coupling agents, γ-glycidoxypropyl trimethoxysilane and γ-methacryloxypropyl trimethoxysilane are preferably used in view of a good adhesion property, a less yellow discoloration, etc. The amount of the silane coupling agent added to the resin composition (C) is usually from about 0.1 to about 5 parts by mass and preferably from 0.2 to 3 parts by mass on the basis of 100 parts by mass of the resin composition (C). In addition to the silane coupling agent, the other coupling agent such as an organic titanate compound may also be effectively used.

Examples of the antioxidant include commercially available products of various types such as monophenol-based antioxidants, bisphenol-based antioxidants, high-molecular phenol-based antioxidants, sulfur-based antioxidants and phosphite-based antioxidants. Specific examples of the monophenol-based antioxidants include 2,6-di-tert-butyl-p-cresol, butylated hydroxyanisole and 2,6-di-tert-butyl-4-ethyl phenol. Specific examples of the bisphenol-based antioxidants include 2,2'-methylene-bis(4-methyl-6-tert-butyl phenol), 2,2'-methylene-bis(4-ethyl-6-tert-butyl phenol), 4,4'-thio-bis(3-methyl-6-tert-butyl phenol), 4,4'-butylidene-bis(3-methyl-6-tert-butyl phenol) and 3,9-bis[{1,1-dimethyl-2-{β-(3-tert-butyl-4-hydroxy-5-methylphenyl) propionyloxy}ethyl]2,4,9,10-tetraoxaspiro]5,5-undecane.

Specific examples of the high-molecular phenol-based antioxidants include 1,1,3-tris-(2-methyl-4-hydroxy-5-tert-butylphenyl)butane, 1,3,5-trimethyl-2,4,6-tris(3,5-di-tert-butyl-4-hydroxybenzyl)benzene, tetrakis-{methylene-3-(3', 5'-di-tert-butyl-4'-hydroxyphenyl)propionate}methane, bis{(3,3'-bis-4'-hydroxy-3'-tert-butylphenyl)butyric acid]glycol ester, 1,3,5-tris(3',5'-di-tert-butyl-4'-hydroxybenzyl)-s-triazin-2,4,6-(1H,3H,5H)trione and triphenol (vitamin E).

Specific examples of the sulfur-based antioxidants include dilauryl thiodipropionate, dimyristyl thiodipropionate and distearyl thiopropionate.

Specific examples of the phosphite-based antioxidants include triphenyl phosphite, diphenyl isodecyl phosphite, phenyl diisodecyl phosphite, 4,4'-butylidene-bis(3-methyl-6-tert-butylphenyl-di-tridecyl)phosphite, cyclic neopentan-tetra-yl bis(octadecyl phosphite), tris(mono- and/or di-)phenyl phosphite, diisodecyl pentaerythritol diphosphite, 9,10-dihydro-9-oxa-10-phosphaphenanthrene-10-oxide, 10-(3,5-di-tert-butyl-4-hydroxybenzyl)-9,10-dihydro-9-oxa-10-phosphaphenanthrene-10-oxide, 10-decyloxy-9,10-dihydro-9-oxa-10-phosphaphenanthrene, cyclic neopentan-tetra-yl bis(2,4-di-tert-butylphenyl)phosphite, cyclic neopentan-tetra-yl bis(2,6-di-tert-methylphenyl)phosphite and 2,2-methylene-bis(4,6-tert-butylphenyl)octyl phosphite.

In the present invention, among these antioxidants, phenol-based antioxidants and phosphite-based antioxidants are preferably used in view of good anti-oxidizing effects, thermal stability and economy thereof, and combination of both types of the above antioxidants is more preferably used. The amount of the antioxidant added to the resin composition (C) is usually from about 0.1 to about 1 part by mass and preferably from 0.2 to 0.5 part by mass on the basis of 100 parts by mass of the resin composition (C).

Examples of the ultraviolet absorber include commercially available products of various types such as benzophenone-based ultraviolet absorbers, benzotriazole-based ultraviolet absorbers, triazine-based ultraviolet absorbers and salicylic acid ester-based ultraviolet absorbers. Specific examples of the benzophenone-based ultraviolet absorbers include 2-hydroxy-4-methoxybenzophenone, 2-hydroxy-4-methoxy-2'-carboxybenzophenone, 2-hydroxy-4-octoxybenzophenone, 2-hydroxy-4-n-dodecyloxybenzophenone, 2-hydroxy-4-n-octadecyloxybenzophenone, 2-hydroxy-4-benzyloxybenzophenone, 2-hydroxy-4-methoxy-5-sulfobenzophenone, 2-hydroxy-5-chlorobenzophenone, 2,4-dihydroxybenzophenone, 2,2'-dihydroxy-4-methoxybenzophenone, 2,2'-dihydroxy-4,4'-dimethoxybenzophenone and 2,2',4,4'-tetrahydroxybenzophenone.

The benzotriazole-based ultraviolet absorbers are in the form of a hydroxyphenyl-substituted benzotriazole compound. Specific examples of the hydroxyphenyl-substituted benzotriazole compound include 2-(2-hydroxy-5-methylphenyl)benzotriazole, 2-(2-hydroxy-5-t-butylphenyl)benzotriazole, 2-(2-hydroxy-3,5-dimethylphenyl)benzotriazole, 2-(2-methyl-4-hydroxyphenyl)benzotriazole, 2-(2-hydroxy-3-methyl-5-t-butylphenyl)benzotriazole, 2-(2-hydroxy-3,5-di-t-amyl phenyl)benzotriazole and 2-(2-hydroxy-3,5-di-t-butylphenyl)benzotriazole. Specific examples of the triazine-based ultraviolet absorbers include 2-[4,6-bis(2,4-dimethylphenyl)-1,3,5-triazin-2-yl)-5-(octyloxy)phenol and 2-(4,6-diphenyl-1,3,5-triazin-2-yl)-5-(hexyloxy)phenol.

Specific examples of the salicylic acid ester-based ultraviolet absorbers include phenyl salicylate and p-octyl phenyl salicylate.

The amount of the ultraviolet absorber added to the resin composition (C) is usually from about 0.01 to 2.0 parts by mass and preferably from 0.05 to 0.5 part by mass on the basis of 100 parts by mass of the resin composition (C).

As the weathering stabilizer other than the above ultraviolet absorbers which is capable of imparting a good weathering property to the resin composition, there may be suitably used hindered amine-based light stabilizers. The hindered amine-based light stabilizers have a less function of absorbing ultraviolet light as compared to the ultraviolet absorbers. However, the use of the hindered amine-based light stabilizers in combination with the ultraviolet absorbers results in considerable synergistic effect. Also, there are known light stabilizers other than the hindered amine-based light stabilizers. However, many of the other light stabilizers are undesirably colored or tinted. Therefore, these other light stabilizers are unsuitable for use in the encapsulant material for solar cells according to the present invention.

Specific examples of the hindered amine-based light stabilizers include dimethyl succinate-1-(2-hydroxyethyl)-4-hydroxy-2,2,6,6-tetramethyl piperidine polycondensate, poly[{6-(1,1,3,3-tetramethylbutyl)amino-1,3,5-triazin-2,4-diyl}{2,2,6,6-tetramethyl-4-piperidypimino}hexamethylene {{2,2,6,6-tetramethyl-4-piperidyl}imino}], N,N'-bis(3-aminopropyl)ethylenediamine-2,4-bis[N-butyl-N-(1,2,2,6,6-pentamethyl-4-piperidyl)amino]-6-chloro-1,3,5-triazine polycondensate, and bis(2,2,6,6-tetramethyl-4-piperidyl)sebacate, 2-(3,5-di-tert-4-hydroxybenzyl)-2-n-butyl malonic acid bis(1,2,2,6,6-pentamethyl-4-piperidyl). The amount of the hindered amine-based light stabilizer added to the resin composition (C) is usually from about 0.01 to about 0.5 part by mass and preferably from 0.05 to 0.3 part by mass on the basis of 100 parts by mass of the resin composition (C).

[Encapsulant Material for Solar Cells]

The encapsulant material for solar cells according to the present invention is composed of the above resin composition (C).

The flexibility of the encapsulant material for solar cells according to the present invention may be appropriately adjusted in view of a shape, a thickness and an installation place of the solar cell to which the encapsulant material is applied. For example, the encapsulant material preferably has a storage elastic modulus (E') of from 1 to 2000 MPa as measured with respect to a dynamic viscoelasticity thereof at an oscillation frequency of 10 Hz at a temperature of 20° C. The lower storage elastic modulus (E') of the encapsulant material is more suitable from the viewpoint of protecting the solar cell elements. However, in view of a handling property of the encapsulant material for solar cells according to the present invention when used in the form of a sheet, as well as anti-blocking between surfaces of the sheets, the storage elastic modulus (E') thereof is more preferably from 3 to 1000 MPa, still more preferably from 5 to 500 MPa and especially preferably from 10 to 100 MPa. The storage elastic modulus (E') of the encapsulant material may be determined by measuring an elastic modulus value of the encapsulant material at an oscillation frequency of 10 Hz at a given temperature using a viscoelasticity measuring apparatus and converting the thus measured value into the corresponding value at 20° C.

The heat resistance of the encapsulant material for solar cells according to the present invention may be influenced by various properties of the ethylene-α-olefin random copolymer (A) (such as crystal fusion peak temperature, heat of crystal fusion, MFR, molecular weight, etc.) and various properties of the ethylene-α-olefin block copolymer (B) (such as crystal fusion peak temperature, heat of crystal fusion, MFR, molecular weight, etc.), in particular, is more strongly influenced by the crystal fusion peak temperature of the ethylene-α-olefin block copolymer (B). In general, the solar cell module is heated to a temperature of from about 85 to about 90° C. owing to heat generated upon power generation and radiation heating by sunlight. Even under the heating conditions, when the crystal fusion peak temperature is 100° C. or higher, the encapsulant material for solar cells according to the present invention can ensure a suitable heat resistance. In the present invention, the heat resistance of the encapsulant material is evaluated as follows. That is, a 0.5 mm-thick sheet-like encapsulant material is interposed between a 3 mm-thick opaque glass (size: 75 mm in length×25 mm in width) and a 5 mm-thick aluminum plate (size: 120 mm in length×60 mm in width), and press-laminated together at 150° C. for 15 min using a vacuum press laminating machine to prepare a sample. The thus prepared sample is placed in a thermostat held at 100° C. in a 60° inclined state to observe the condition thereof after the elapse of 500 h. The heat resistance of the encapsulant material is evaluated according to the following ratings.

○: No displacement of glass from an initial reference position occurred; and

X: Displacement of glass from an initial reference position occurred, or the sheet was melted.

The total light transmission of the encapsulant material for solar cells according to the present invention may not be important depending upon kinds of solar cells to which the encapsulant material is applied, for example, those of an amorphous thin film silicon type, etc., or when the encapsulant material is applied to such portions where sunlight directed toward the solar cell elements is not obstructed. However, in view of a photovoltaic energy conversion efficiency of the solar cell and a handling property upon stacking various members, the total light transmission of the encapsulant material is preferably 85% or more, more preferably 87% or more and still more preferably 90% or more.

The flexibility, heat resistance and transparency of the encapsulant material for solar cells according to the present invention tend to be contradictory to each other. More specifically, if the crystallinity of the resin composition (C) is excessively lowered in order to enhance a flexibility of the encapsulant material, the encapsulant material tends to be deteriorated and insufficient in heat resistance. On the other hand, if the crystallinity of the resin composition (C) is excessively increased in order to enhance a heat resistance of the encapsulant material, the encapsulant material tends to be deteriorated and insufficient in transparency. In the present invention, in order to attain a good balance between these properties, when using a storage elastic modulus (E') of the encapsulant material as measured with respect to a dynamic viscoelasticity thereof at an oscillation frequency of 10 Hz at a temperature of 20° C. as an index of the flexibility, a crystal fusion peak temperature of the ethylene-α-olefin block copolymer (B) as measured in differential scanning calorimetry at a heating rate of 10° C./min as an index of the heat resistance, and a total light transmission of the encapsulant material as an index of the transparency, the storage elastic modulus (E'), crystal fusion peak temperature and total light transmission are preferably from 1 to 2000 MPa, 100° C. or higher and 85% or more, respectively; more preferably from 5 to 500 MPa, from 105 to 145° C. and 85% or more, respectively; and especially preferably from 10 to 100 MPa, from 110 to 145° C. and 90% or more, respectively.

[Method for Producing Encapsulant Material for Solar Cells]

Next, the method for producing the encapsulant material for solar cells according to the present invention is described. The thickness of the encapsulant material is not particularly limited, and the encapsulant material is used in the form of a sheet having a thickness of usually from about 0.05 to about 1 mm and preferably from 0.1 to 0.7 mm. As the method of forming the sheet-like encapsulant material for solar cells, there may be employed conventionally known methods, for example, an extrusion casting method using a T-die in which melting and mixing facilities such as a single-screw extruder, a multi-screw extruder, a Banbury mixer and a kneader are also used, a calendering method, etc. In the present invention, the extrusion casting method using a T-die is more suitably employed from the viewpoints of a good handling property and a high productivity, although not particularly limited thereto. The molding temperature used in the extrusion casting method using a T-die may be adequately adjusted according to flow property and film-forming property of the resin composition (C) used, and is generally from 130 to 300° C. and preferably from 150 to 250° C. Various additives such as a silane coupling agent, an antioxidant, an ultraviolet absorber and a weathering stabilizer may be previously dry-blended with the resins, and the obtained dry-blends may be supplied to a hopper. Alternatively, all of the materials may be previously melted and mixed with each other to prepare pellets thereof, and the pellets may be supplied to a hopper. In addition, the additives may be previously blended in resins at a high concentration to prepare a master batch, and the master batch may be supplied to a hopper. The front and/or back surfaces of the encapsulant material for solar cells according to the present invention which is obtained in the form of a sheet may also be subjected, if required, to embossing or various processes for forming irregularities (such as those having a conical, truncated pyramid or semi-spherical shape) for the purpose of preventing occurrence of blocking between portions of the sheet when formed into a roll, or enhancing a handling property or facilitating removal of air upon the encapsulant step for the solar cell elements. Further, when forming the encapsulant material into a sheet, another base film (such as an oriented polyester film (OPET) and an oriented polypropylene film (OPP)) may be laminated on the sheet by various lamination methods such as extrusion lamination and sandwich lamination.

[Solar Cell Module]

The encapsulant material for solar cells according to the present invention is used for fixing the solar cell elements between a front sheet and a back sheet which serve as upper and lower protective materials, respectively, to thereby produce a solar cell module. Illustrative of such a solar cell module are various types, and the solar cell module is preferably constituted from the encapsulant material for solar cells according to the present invention, the upper protective material, the solar cell elements and the lower protective material. More specifically, the solar cell module may have a structure in which the upper protective material, the encapsulant material (encapsulant resin layer), the solar cell elements, the encapsulant material (encapsulant resin layer) and the lower protective material are successively formed in this order so as to sandwich the solar cell elements between the encapsulant materials from both sides thereof (refer to FIG. 1); a structure in which the encapsulant material and the upper protective material are successively formed on the solar cell elements formed on an inner peripheral surface of the lower protective material; and a structure in which the encapsulant material and the lower protective material are successively formed on the solar cell elements formed on an inner peripheral surface of the upper protective material, for example, amorphous solar cell elements formed on a fluororesin-based transparent protective material by sputtering, etc. Meanwhile, in the solar cell module produced using the encapsulant material for solar cells according to the present invention, when two or more portions in the module should be encapsulated with an encapsulant material, the encapsulant material for solar cells according to the present invention may be used for encapsulating all of the portions, or may be used for encapsulating only one portion thereof. In addition, when the encapsulant material for solar cells according to the present invention is used to encapsulate two or more portions in the module, the resin compositions (C) contained in the respective encapsulant materials used for encapsulating the two or more portions may be the same or different from each other.

The solar cell elements are disposed between the encapsulant resin layers and connected to each other by wiring. Examples of the solar cell elements include those of a monocrystalline silicon type, a polycrystalline silicon type, an amorphous silicon type, a semiconductor type constituted from compounds of III-V group elements or II-VI group elements such as gallium-arsenic, copper-indium-selenium and cadmium-tellurium, a dye sensitizing type and an organic thin film type.

The respective members constituting the solar cell module produced using the encapsulant material for solar cells according to the present invention are not particularly limited. Examples of the upper protective material include single-layer or multilayer protective materials of a plate shape or a film shape which are made of glass, acrylic resins, polycarbonates, polyesters, fluorine-containing resins, etc. The lower protective material may be constituted from a single-layer or multilayer sheet such as metal sheets and various thermoplastic resin films. Examples of the lower protective material include single-layer or multilayer protective materials which are made of metals such as tin, aluminum and stainless steel, inorganic materials such as glass, polyesters, inorganic material-vapor deposited polyesters, fluorine-containing resins and polyolefins. The upper and/or lower protective materials may be subjected to conventionally known surface treatments such as is primer treatment and corona treatment in order to enhance adhesion between the encapsulant material for solar cells according to the present invention and the other members.

The solar cell module produced using the encapsulant material for solar cells according to the present invention is illustrated and described below with respect to such a solar cell module having a structure in which the upper protective material, the encapsulant material (encapsulant resin layer), the solar cell elements, the encapsulant material (encapsulant resin layer) and the lower protective material are successively formed in this order so as to sandwich the solar cell elements between the encapsulant materials from both sides thereof. In the solar cell module as shown in FIG. 1, a transparent substrate 10, an encapsulant resin layer 12A formed of the encapsulant material for solar cells according to the present invention, solar cell elements 14A, 14B, an encapsulant resin layer 12B formed of the encapsulant material for solar cells according to the present invention, and a back sheet 16 are successively laminated from a sunlight receiving side thereof. In addition, a junction box 18 (a terminal box which is connected with a wiring for transmitting an electricity generated from the solar cell elements to outside) is bonded to a lower surface of the back sheet 16. The solar cell elements 14A and 14B are connected with each other through a wiring 20 to electrically transmit an electric current generated to outside. The wiring 20 is passed through a through-hole (not shown)

formed in the back sheet 16 and derived therefrom outside, and connected to the junction box 18.

The solar cell module may be produced by conventionally known methods, and the production method for the solar cell module is therefore not particularly limited. In general, the method of producing the solar cell module includes a step of successively laminating the upper protective material, the encapsulant resin layer, the solar cell elements, the encapsulant resin layer and the lower protective material in this order, and a step of subjecting the resulting laminate to vacuum suction and thermocompression-bonding. In addition, in the production method, there may also be used a batch type production facility or a roll-to-roll type production facility.

The solar cell module produced using the encapsulant material for solar cells according to the present invention can be employed in various indoor and outdoor applications such as small-size solar cells for used in typically mobile equipments as well as large-size solar cells installed onto roofs or rooftops depending upon types of the solar cells or shapes of the modules.

EXAMPLES

The present invention is described in more detail by referring to the following Examples. However, these Examples are only illustrative and not intended to limit the present invention thereto. Meanwhile, various characteristic values or properties of the sheets described in the present specification were measured and evaluated by the following methods. In the followings, the flow direction of a sheet extruded from an extruder is hereinafter referred to as a "longitudinal direction", whereas the direction perpendicular to the flow direction is hereinafter referred to as a "lateral direction".

(1) Crystal Fusion Peak Temperature (Tm)

Using a differential scanning calorimeter ("Pyris 1 DSC" (tradename) available from Perkin Elmer, Inc., about 10 mg of a sample were heated from –40° C. to 200° C. at a heating rate of 10° C./min, held at 200° C. for 5 min, cooled to –40° C. at a cooling rate of 10° C./min, and then heated again to 200° C. at a heating rate of 10° C./min according to JIS K 7121 to measure and prepare a thermogram of the sample. The crystal fusion peak temperature (Tm; ° C.) of the sample was determined from the thus prepared thermogram.

(2) Heat of Crystal Fusion ($\Delta$Hm)

Using a differential scanning calorimeter ("Pyris 1 DSC" (tradename) available from Perkin Elmer, Inc., about 10 mg of a sample were heated from –40° C. to 200° C. at a heating rate of 10° C./min, held at 200° C. for 5 min, cooled to –40° C. at a cooling rate of 10° C./min, and then heated again to 200° C. at a heating rate of 10° C./min according to JIS K 7122 to measure and prepare a thermogram of the sample. The heat of crystal fusion ($\Delta$Hm; J/g) of the sample was determined from the thus prepared thermogram.

(3) Flexibility

Using a viscoelasticity measuring apparatus "Viscoelasticity Spectrometer DVA-200" (tradename) available from IT Keisoku Seigyo Co., Ltd., a viscoelasticity of a sample (4 mm in length×60 mm in width) was measured along its lateral direction in a temperature range of from –150° C. to 150° C. at an oscillation frequency of 10 Hz, a distortion rate of 0.1%, a temperature rise rate of 3° C./min and a distance between chucks of 25 mm. The storage elastic modulus (E') (MPa) at 20° C. of the sample was determined from the thus obtained data.

(4) Heat Resistance

A 0.5 mm-thick sheet-like encapsulant material is interposed between a 3 mm-thick opaque glass (size: 75 mm in length×25 mm in width) and a 5 mm-thick aluminum plate (size: 120 mm in length×60 mm in width), and press-laminated together at 150° C. for 15 min using a vacuum press laminating machine to prepare a sample. The thus prepared sample is placed in a thermostat held at 100° C. in a 60° inclined state to observe the condition thereof after the elapse of 500 h. The results are evaluated according to the following ratings.

◯: No displacement of glass from an initial reference position occurred; and

X: Displacement of glass from an initial reference position occurred, or the sheet was melted.

(5) Total Light Transmission

A 0.5 mm-thick sheet-like encapsulant material is interposed between two pieces of 3 mm-thick opaque glass (size: 75 mm in length×25 mm in width), and press-laminated together at 150° C. for 15 min using a vacuum press laminating machine to prepare a sample. The total light transmission of the thus obtained sample was measured according to JIS K 7105. The total light transmission values thus measured were evaluated according to the following ratings. The total light transmission values as well as the evaluation results are shown in Table 1 below.

⊚: Total light transmission of 90% or more;

◯: Total light transmission of not less than 85% and less than 90%; and

X: Total light transmission of less than 85%, or white turbidity was clearly recognized (but not measured).

Example 1

95 parts by mass of an ethylene-octene random copolymer ("Engage 8200" (tradename) available from Dow Chemical Co.; octene content: 7.3 mol % (24% by mass); MFR: 5; Tm: 65° C.; $\Delta$Hm: 53 J/g) as the ethylene-$\alpha$-olefin random copolymer (A) (hereinafter referred to merely "A-1") and 5 parts by mass of an ethylene-octene block copolymer ("Infuse D9100.05" (tradename) available from Dow Chemical Co.; octene content: 12.8 mol % (37% by mass); MFR: 1; Tm: 119° C.; $\Delta$Hm: 38 J/g) as the ethylene-$\alpha$-olefin block copolymer (B) (hereinafter referred to merely "B-1") were mixed with each other to prepare a resin composition (C). The thus prepared resin composition (C) was melted and kneaded using a 40 mm$\phi$ single-screw extruder equipped with a T-die at a set temperature of 200° C., and then rapidly cooled and formed into a film using a cast roll held at 20° C. to obtain a 0.5 mm-thick sheet-like encapsulant material for solar cells (hereinafter referred to merely as a "sheet"). The resulting sheet was evaluated by the methods as described above. The results are shown in Table 1.

Example 2

The same procedure as in Example 1 was repeated except that the resin composition forming the sheet was replaced with the resin composition containing 80 parts by mass of the (A-1) and 20 parts by mass of an ethylene-octene block copolymer ("Infuse D9507.15" (tradename) available from Dow Chemical Co.; octene content: 16.4 mol % (44% by mass); MFR: 5; Tm: 123° C.; $\Delta$Hm: 21 J/g) (hereinafter referred to merely "B-2") as shown in Table 1, thereby obtaining a 0.5 mm-thick sheet. The resulting sheet was evaluated by the methods as described above. The results are shown in Table 1.

Example 3

The same procedure as in Example 1 was repeated except that the resin composition forming the sheet was replaced with the resin composition using an ethylene-propylene-hexene random terpolymer ("Karnel KJ640T" (tradename) available from Japan Polyethylene Corp.; propylene content: 7.4 mol % (10% by mass); hexene content: 4.4 mol % (10% by mass); MFR: 30; Tm: 53° C.; ΔHm: 58 J/g) (hereinafter referred to merely "A-2") in place of the (A-1) as shown in Table 1, thereby obtaining a 0.5 mm-thick sheet. The resulting sheet was evaluated by the methods as described above. The results are shown in Table 1.

Comparative Example 1

The same procedure as in Example 1 was repeated except that the resin composition forming the sheet was replaced with the resin composition containing no (B-1) and containing 100 parts by mass of the (A-1) as shown in Table 1, thereby obtaining a 0.5 mm-thick sheet. The resulting sheet was evaluated by the methods as described above. The results are shown in Table 1.

Comparative Example 2

The same procedure as in Example 1 was repeated except that the resin composition forming the sheet was replaced with the resin composition using an ethylene-octene random copolymer as an ordinary crystalline polyethylene resin ("Moretech 0238CN" (tradename) available from Prime Polymer Co., Ltd.; octene content: 1 mol % (4% by mass); MFR: 2.1; Tm: 121° C.; ΔHm: 127 J/g) (hereinafter referred to merely "P-1") in place of the (B-1) as shown in Table 1, thereby obtaining a 0.5 mm-thick sheet. The resulting sheet was evaluated by the methods as described above. The results are shown in Table 1.

Comparative Example 3

The same procedure as in Example 1 was repeated except that the resin composition forming the sheet was replaced with the resin composition containing 100 parts by mass of the (P-1) without using the (A-1) and the (B-1) as shown in Table 1, thereby obtaining a 0.5 mm-thick sheet. The resulting sheet was evaluated by the methods as described above. The results are shown in Table 1.

TABLE 1

| Raw materials (part(s) by mass) | | Examples | | | Comparative Examples | | |
|---|---|---|---|---|---|---|---|
| | | 1 | 2 | 3 | 1 | 2 | 3 |
| (A) | A-1 | 95 | 80 | | 100 | 95 | |
| | A-2 | | | 95 | | | |
| (B) | B-1 | 5 | | | | 5 | |
| | B-2 | | 20 | | | | |
| — | P-1 | | | | | 5 | 100 |
| Flexibility: storage elastic modulus (E') (MPa) | | 12 | 16 | 27 | 12 | 38 | 2640 |
| Heat resistance | | ○ | ○ | ○ | X | ○ | ○ |
| Total light transmission (%) | | 90.4 | 87.1 | 88.5 | 92.0 | 83.9 | (*) |
| | | ⊚ | ○ | ○ | ⊚ | X | X |

Note
*: White turbidity occurred

From Table 1, it was confirmed that the encapsulant materials for solar cells produced from the resin compositions as defined in the present invention were excellent in all of flexibility, heat resistance and transparency (total light transmission) (Examples 1 to 3). On the other hand, it was confirmed that the encapsulant materials composed of the resin compositions not containing the block copolymer as defined in the present invention were unsatisfactory in any one or more of flexibility, heat resistance and transparency (total light transmission) (Comparative Examples 1 to 3). More specifically, the encapsulant material composed of the resin composition not containing the block copolymer according to the present invention was insufficient in heat resistance (Comparative Example 1), or when it was intended to improve a heat resistance of the encapsulant material obtained in Comparative Example 1 by using the ordinary polyethylene resin, it was confirmed that the resulting encapsulant material exhibited a good heat resistance but was insufficient in transparency (total light transmission) (Comparative Example 2).

Example 4

Using a vacuum press laminating machine "LM 30×30" (tradename) available from NPC Inc., a 3 mm-thick opaque glass ("Solite" (tradename) available from Asahi Glass Co., Ltd.) as the upper protective material, the 0.5 mm-thick sheet (encapsulant material) obtained in Example 1, solar cell elements having a thickness of 0.4 mm ("101×101 mM" (Model No.) available from Photowatt Inc.), the 0.5 mm-thick sheet (encapsulant material) obtained in Example 1, and a 0.125 mm-thick weather-resistant PET film ("Lumilar X10S" (tradename) available from Toray Industries, Inc.) as the lower protective material, were successively stacked in this order from a hot plate side of the laminator to form a 5-layered sheet, and the 5-layered sheet was vacuum-pressed at a hot plate temperature of 150° C. for a processing time of 20 min (including 5 min for vacuum drawing, 5 min for pressing and 10 min for pressure retention) under the condition of a compression-bonding rate of "Rapid" to produce a solar cell module (size: 150 mm×150 mm). The thus produced solar cell module was excellent in transparency and appearance.

EXPLANATION OF REFERENCE NUMERALS

10: Transparent substrate; 12A, 12B: encapsulant resin layers; 14A, 14B: Solar cell elements; 16: Back sheet; 18: Junction box; 20: Wiring

The invention claimed is:
1. A encapsulant material for solar cells, comprising a resin composition (C) comprising an ethylene-α-olefin random copolymer (A) that satisfies the following condition (a) and an ethylene-α-olefin block copolymer (B) that satisfies the following condition (b):
   (a) a heat of crystal fusion is from 0 to 70 J/g as measured in differential scanning calorimetry at a heating rate of 10° C./min; and
   (b) a crystal fusion peak temperature is 100° C. or higher and a heat of crystal fusion is from 5 to 70 J/g as measured in differential scanning calorimetry at a heating rate of 10° C./min;
   wherein the content of the ethylene-α-olefin random copolymer (A) in the resin composition (C) is from 50 to 99% by mass based on the content of the resin composition (C); and
   wherein the content of the ethylene-α-olefin block copolymer (B) in the resin composition (C) is from 1 to 50% by mass based on the content of the resin composition (C); and
   wherein the content of the α-olefin copolymerized with ethylene in the ethylene-α-olefin random copolymer (A)

is less than 40 mol % on the basis of 100 mol % of whole monomer units contained in the ethylene-α-olefin random copolymer (A); and wherein the encapsulant material has a total light transmission of 85% or more where total light transmission is measured by a method of interposing a 0.5 mm-thick sheet-like encapsulant material between two pieces of 3 mm-thick opaque glass (size: 75 mm in length×25 mm in width), and press-laminated together at 150° C. for 15 min using a vacuum press laminating machine to prepare a sample and the total light transmission of the thus obtained sample is measured according to JIS K 7105.

2. The encapsulant material for solar cells according to claim 1, wherein the ethylene-α-olefin random copolymer (A) has a heat of crystal fusion of from 5 to 70 J/g.

3. The encapsulant material for solar cells according to claim 1, wherein the ethylene-α-olefin block copolymer (B) has a crystal fusion peak temperature of from 105 to 145° C.

4. The encapsulant material for solar cells according to claim 1, wherein the ethylene-α-olefin block copolymer (B) has a heat of crystal fusion of from 10 to 60 J/g.

5. The encapsulant material for solar cells according to claim 1, wherein the ethylene-α-olefin block copolymer (B) is an ethylene-octene multi-block copolymer.

6. The encapsulant material for solar cells according to claim 1, wherein the α-olefin constituting the ethylene-α-olefin random copolymer (A) is the same as that constituting the ethylene-α-olefin block copolymer (B).

7. The encapsulant material for solar cells according to claim 1, wherein the resin composition (C) further comprises at least one additive selected from the group consisting of a silane coupling agent, an antioxidant, an ultraviolet absorber and a weathering stabilizer.

8. The encapsulant material for solar cells according to claim 1, wherein the encapsulant material has a storage elastic modulus (E') of from 10 to 100 MPa as measured with respect to a dynamic viscoelasticity thereof at an oscillation frequency of 10 Hz at a temperature of 20° C., a crystal fusion peak temperature of from 110 to 145° C. as measured in differential scanning calorimetry at a heating rate of 10° C./min, and a total light transmission of 90% or more.

9. A solar cell module produced by using the encapsulant material for solar cells as defined in claim 1.

10. A solar cell module produced by using the encapsulant material for solar cells as defined in claim 1, an upper protective material, solar cell elements and a lower protective material.

11. The encapsulant material for solar cells according to claim 3, wherein the ethylene-α-olefin block copolymer (B) has a heat of crystal fusion of from 10 to 60 J/g.

12. The encapsulant material for solar cells according to claim 5, wherein the α-olefin constituting the ethylene-α-olefin random copolymer (A) is the same as that constituting the ethylene-α-olefin block copolymer (B).

13. The encapsulant material for solar cells according to claim 1, wherein the content of the ethylene-α-olefin random copolymer (A) in the resin composition (C) is from 60 to 98% by mass based on the content of the resin composition (C); and wherein the content of the ethylene-α-olefin block copolymer (B) in the resin composition (C) is from 2 to 40% by mass based on the content of the resin composition (C).

14. The encapsulant material for solar cells according to claim 1, wherein the content of the ethylene-α-olefin random copolymer (A) in the resin composition (C) is from 70 to 97% by mass based on the content of the resin composition (C); and wherein the content of the ethylene-α-olefin block copolymer (B) in the resin composition (C) is from 3 to 30% by mass based on the content of the resin composition (C).

15. The encapsulant material for solar cells according to claim 1, wherein the content of the α-olefin in the ethylene-α-olefin random copolymer (A) is from 2 to 40 mol % on the basis of 100 mol % of whole monomer units contained in the ethylene-α-olefin random copolymer (A).

16. The encapsulant material for solar cells according to claim 1, wherein the content of the α-olefin in the ethylene-α-olefin random copolymer (A) is from 3 to 30 mol % on the basis of 100 mol % of whole monomer units contained in the ethylene-α-olefin random copolymer (A).

17. The encapsulant material for solar cells according to claim 1, wherein the content of the α-olefin in the ethylene-α-olefin random copolymer (A) is from 5 to 25 mol % on the basis of 100 mol % of whole monomer units contained in the ethylene-α-olefin random copolymer (A).

18. The encapsulant material for solar cells according to claim 1, wherein the encapsulant material has a total light transmission of 87% or more.

19. The encapsulant material for solar cells according to claim 1, wherein the encapsulant material has a total light transmission of 90% or more.

* * * * *